(12) United States Patent
Sato et al.

(10) Patent No.: US 9,614,011 B2
(45) Date of Patent: Apr. 4, 2017

(54) ELECTROLUMINESCENCE DISPLAY DEVICE

(71) Applicant: Japan Display Inc., Tokyo (JP)

(72) Inventors: Toshihiro Sato, Tokyo (JP); Hironori Toyoda, Tokyo (JP); Jun Fujiyoshi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/978,639

(22) Filed: Dec. 22, 2015

(65) Prior Publication Data

US 2016/0111474 A1    Apr. 21, 2016

Related U.S. Application Data

(63) Continuation of application No. 14/683,628, filed on Apr. 10, 2015, now Pat. No. 9,257,491, which is a
(Continued)

(30) Foreign Application Priority Data

Oct. 23, 2012    (JP) .................................. 2012-234154

(51) Int. Cl.
  *H01L 29/04*    (2006.01)
  *H01L 27/32*    (2006.01)
  (Continued)

(52) U.S. Cl.
  CPC ........ *H01L 27/322* (2013.01); *H01L 27/3218* (2013.01); *H01L 27/3246* (2013.01);
  (Continued)

(58) Field of Classification Search
  CPC ... H01L 27/322; H01L 27/3246; H01L 33/10; H01L 51/5253; H01L 51/5206;
  (Continued)

(56) References Cited

U.S. PATENT DOCUMENTS 8,237,351 B2    8/2012    Sung et al.
2004/0207570 A1    10/2004    Nishikawa et al.
(Continued)

FOREIGN PATENT DOCUMENTS

CN    1787226 A    6/2006
CN    1815773 A    8/2006
(Continued)

OTHER PUBLICATIONS

Office Action dated on Oct. 28, 2015 regarding Chinese Patent Application No. 201310503877.8.
(Continued)

*Primary Examiner* — Brook Kebede
(74) *Attorney, Agent, or Firm* — TYPHA IP LLC

(57) ABSTRACT

There is provided an EL display device of a color filter system which obtains sufficient brightness and contrast while making it difficult to generate a color mixture even if pixels become fine. An EL display device 100 according to the present invention includes a first substrate 1, a circuit layer 2 formed on the first substrate 1, a color selection reflection layer 11 formed in an upper layer of the circuit layer 2, lower electrodes 5 formed in an upper layer of the color selection reflection layer 11, a white light emission EL layer 7 formed in an upper layer of the lower electrodes 5, an upper electrode 8 formed in an upper layer of the EL layer 7, and a sealing layer 9 formed in an upper layer of the upper electrode 8.

17 Claims, 10 Drawing Sheets

Related U.S. Application Data continuation of application No. 14/057,141, filed on Oct. 18, 2013, now Pat. No. 9,048,369.

(51) Int. Cl.
*H01L 33/10* (2010.01)
*H01L 51/52* (2006.01)
*H01L 51/50* (2006.01)

(52) U.S. Cl.
CPC ...... *H01L 27/3248* (2013.01); *H01L 27/3262* (2013.01); *H01L 33/10* (2013.01); *H01L 51/5206* (2013.01); *H01L 51/5221* (2013.01); *H01L 51/5228* (2013.01); *H01L 51/5246* (2013.01); *H01L 51/5253* (2013.01); *H01L 51/5271* (2013.01); *H01L 51/5284* (2013.01); H01L 51/5036 (2013.01); H01L 51/5234 (2013.01); H01L 2251/301 (2013.01); H01L 2251/305 (2013.01); H01L 2251/308 (2013.01); H01L 2251/5307 (2013.01)

(58) Field of Classification Search
CPC ............. H01L 51/5271; H01L 51/5036; H01L 51/5265; H01L 51/5275
USPC .................................. 257/49–53, 59, 71, 72
See application file for complete search history.

(56) References Cited

U.S. PATENT DOCUMENTS

| | | |
|---|---|---|
| 2007/0290213 A1 | 12/2007 | Kobayashi |
| 2009/0079328 A1 | 3/2009 | Fedorovskaya et al. |
| 2009/0200544 A1 | 8/2009 | Lee et al. |
| 2011/0095675 A1* | 4/2011 | Oda ................... H01L 51/5265 313/499 |

FOREIGN PATENT DOCUMENTS

| | | |
|---|---|---|
| CN | 101262725 A | 9/2008 |
| CN | 101874317 A | 10/2010 |
| JP | 2003-295792 A | 10/2003 |
| JP | 2004-227853 A | 8/2004 |
| JP | 2006-100138 A | 4/2006 |
| JP | 2006-171739 A | 6/2006 |
| JP | 2007-123066 A | 5/2007 |
| JP | 2008-108530 A | 5/2008 |
| JP | 2010-212246 A | 9/2010 |
| JP | 2010-287543 A | 12/2010 |
| JP | 2011-65948 A1 | 3/2011 |
| JP | 2012-018868 A | 1/2012 |
| KR | 10-2009-0087274 A | 8/2009 |
| TW | 201042324 A | 12/2010 |
| WO | 2010/150535 A1 | 12/2010 |
| WO | 2011/021373 A1 | 2/2011 |

OTHER PUBLICATIONS

Office Action dated on Nov. 2, 2015 regarding Taiwanese Patent Application No. 102138003.

Office Action issued by KIPO dated Oct. 20, 2014 of corresponding Korean Application No. 2013-0123085.

Office Action dated on Mar. 31, 2015 regarding Korean Patent Application No. 10-2013-0123085.

Japanese Office Action dated Aug. 2, 2016 for corresponding Japanese Patent Application No. 2012-234154 with Partial English Translation.

* cited by examiner

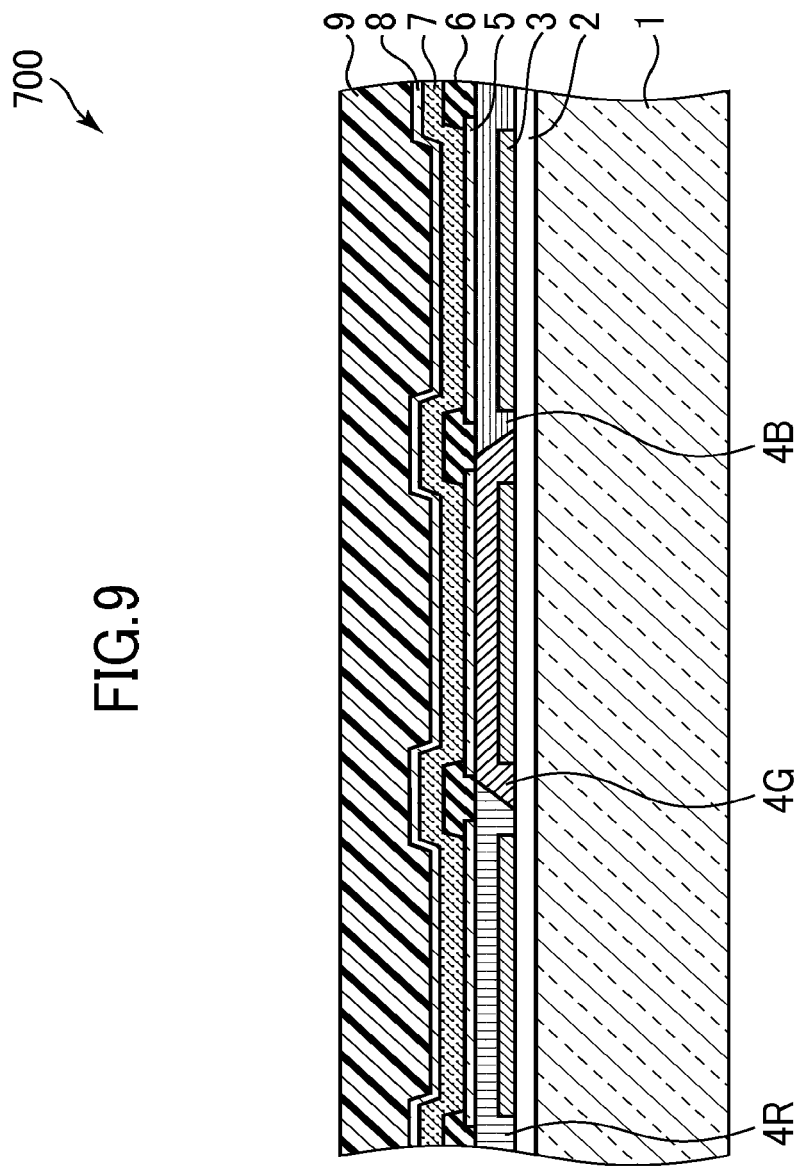

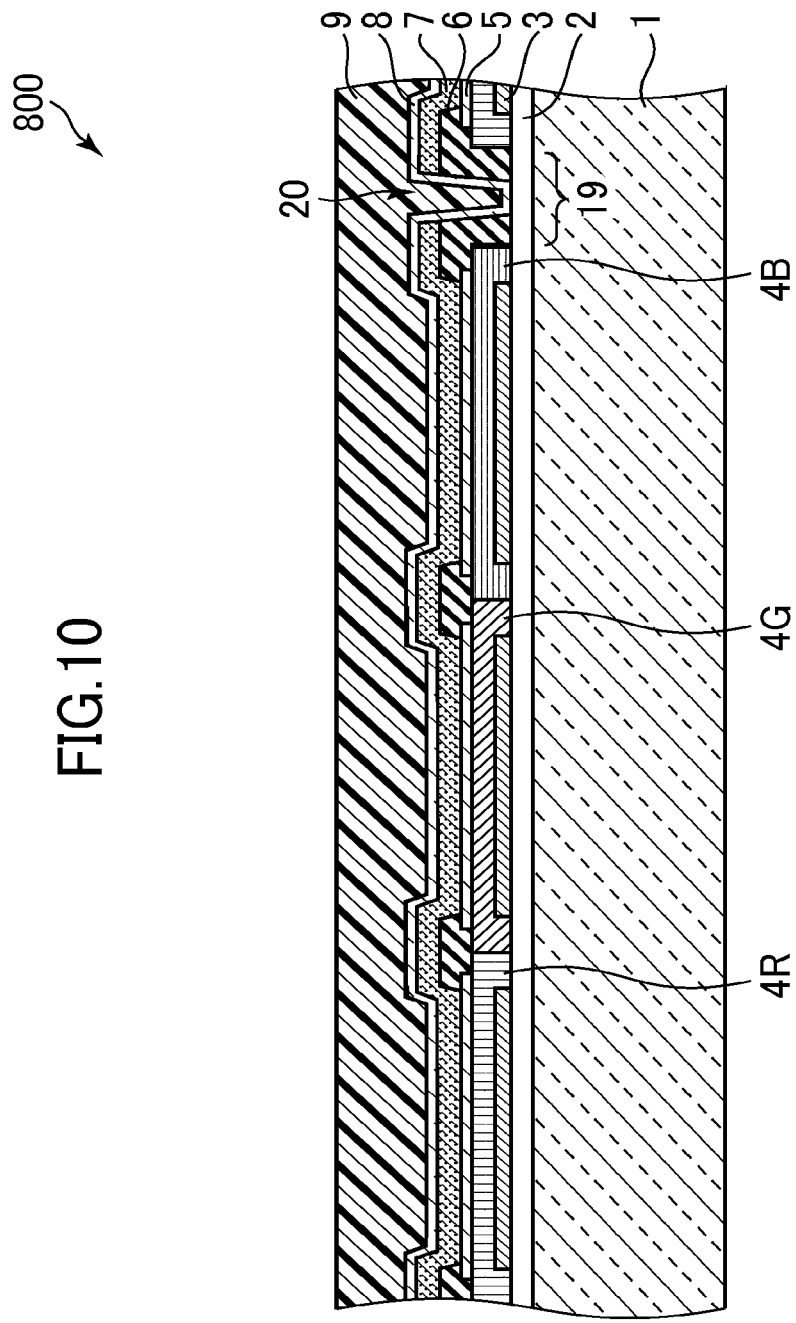

ELECTROLUMINESCENCE DISPLAY DEVICE

CROSS-REFERENCE TO RELATED APPLICATION

This application is a continuation of U.S. patent application Ser. No. 14/683,628, filed on Apr. 10, 2015, which is a continuation of U.S. application Ser. No. 14/057,141 filed on Oct. 18, 2013,(now U.S. Pat. No. 9,048,369), which claims priority form Japanese application JP 2012-234154 filed on Oct. 23, 2012, the contents of which are hereby incorporated by reference into this application.

BACKGROUND OF THE INVENTION

1. Field of the Invention

The present invention relates to an electroluminescence display device.

2. Description of the Related Art

JP 2004-227853 A discloses a color-filter electroluminescence (EL) display device of a bottom emission type. In the EL display device disclosed in that publication, EL element drive TFTs are formed on an insulating substrate, and a color filter layer and a white organic EL layer are further formed in an upper layer of the TFTs in the stated order. The EL display device extracts light emission produced in the white organic EL layer from the insulating substrate side.

JP 2011-65948 A discloses a color filter EL display device of a top emission type. In the EL display device disclosed in this publication, switching elements, a reflection layer arranged in an upper layer of the switching elements, an insulating substrate having the white organic EL layer formed in an upper layer thereof, and a sealing substrate formed with a black matrix and color filters face each other through spaces or resin layers. The EL display device extracts the light emission produced in the white organic EL layer from the sealing substrate side.

SUMMARY OF THE INVENTION

In a structure of the bottom emission type disclosed in JP 2004-227853 A, because the light emission is not extracted from a region in which circuit elements such as the TFTs are arranged, an aperture ratio of pixels is lessened, and sufficient brightness cannot be obtained in a high-definition or downsized display device in which the individual pixels are fine.

Also, in a structure of the top emission type disclosed in JP 2011-65948 A, particularly, in the high-definition or downsized display device in which the individual pixels are fine, a size of pixels and a thickness dimension of the color filters get relatively close to each other. This leads to a problem that the light emission produced in the white organic EL layer is propagated through the space or the resin layer between the insulating substrate and the sealing substrate, and enters adjacent pixels to cause a color mixture.

The present invention has been made in view of the above viewpoint, and therefore an object of the present invention is to provide a color filter EL display device which obtains sufficient brightness and contrast while making it difficult to generate the color mixture even if pixels become fine.

In the invention disclosed in the present application, an outline of typical features will be described in brief below.

(1) An EL display device including: a first substrate; a circuit layer formed on the first substrate; a color selection reflection layer formed in an upper layer of the circuit layer; lower electrodes formed in an upper layer of the color selection reflection layer; a white light emission EL layer formed in an upper layer of the lower electrodes; an upper electrode formed in an upper layer of the EL layer; and a sealing layer formed in an upper layer of the upper electrode.

(2) In the EL display device according to the item (1), the color selection reflection layer includes a reflection layer, and color filters formed in an upper layer of the reflection layer.

(3) In the EL display device according to the item (1), the color selection reflection layer includes a dichroic mirror layer.

(4) In the EL display device according to the item (3), a light absorbing layer is formed on a lower layer of the color selection reflection layer.

(5) In the EL display device according to any one of the items (1) to (4), the upper electrode is a cathode.

(6) In the EL display device according to any one of the items (1) to (5), a partial reflection film is formed in the upper layer of the upper electrode.

(7) In the EL display device according to the item (6), pixel separation films are formed to separate the adjacent lower electrodes from each other, and the partial reflection film is an auxiliary electrode disposed immediately above the pixel separation films.

(8) In the EL display device according to any one of the items (1) to (7), there are provided pixels on which the color selection reflection layer is formed, and pixels of white light emission on which the color selection reflection layer are not formed.

(9) In the EL display device according to any one of the items (1) to (8), there are provided upper color filters arranged in an upper layer of the sealing layer, and a second substrate having the upper color filters formed on a surface thereof.

(10) In the EL display device according to the item (9), a protective layer is formed between the sealing layer and the upper color filters.

(11) In the EL display device according to any one of the items (1) to (10), a protective layer is formed between the color selection reflection layer and the lower electrodes.

(12) In the EL display device according to any one of the items (1) to (11), a boundary between the color selection reflection layers belonging to the adjacent pixels is tapered.

(13) In the EL display device according to any one of the items (1) to (12), the upper electrode is electrically connected to a line included in the circuit layer through a through-hole, and set as a common potential.

(14) In the EL display device according to the item (13), the through-hole is arranged in an region where the color selection reflection layer is not formed.

According to any one of the above items (1) to (3), the EL display device of the color filter system can obtain sufficient brightness and contrast while making it difficult to generate the color mixture even if the pixels become fine.

According to the above item (4), a light beam that is transmitted through the dichroic mirror layer can be prevented from being reflected and visually recognized.

According to the above item (5), a reflectance of the upper electrode is increased, and a color purity of the light emission by the EL display device is improved.

According to the above item (6), the color purity of the light emission by the EL display device is improved.

According to the above item (7), an additional process for forming the partial reflection film becomes unnecessary.

According to the above item (8), the EL display device high in brightness and contrast is obtained.

According to the above item (9), the color purity of the light emission by the EL display device is improved.

According to any one of the above items (10) to (12), the reliability of the EL display device is improved.

According to the above item (13), the potential of the upper electrode becomes even, and even display is obtained.

According to the above item (14), the advantages by the above item (13) are obtained without damaging the EL layer.

BRIEF DESCRIPTION OF THE DRAWINGS

FIG. 9 is a schematic cross-sectional view illustrating a pixel portion of an EL display device according to a seventh embodiment of the present invention; and FIG. 10 is a schematic cross-sectional view illustrating a pixel portion of an EL display device according to an eighth embodiment of the present invention.

DETAILED DESCRIPTION OF THE INVENTION

Hereinafter, an EL display device according to a variety of embodiments of the present invention will be described with reference to the accompanying drawings.

First Embodiment

Figure 1:
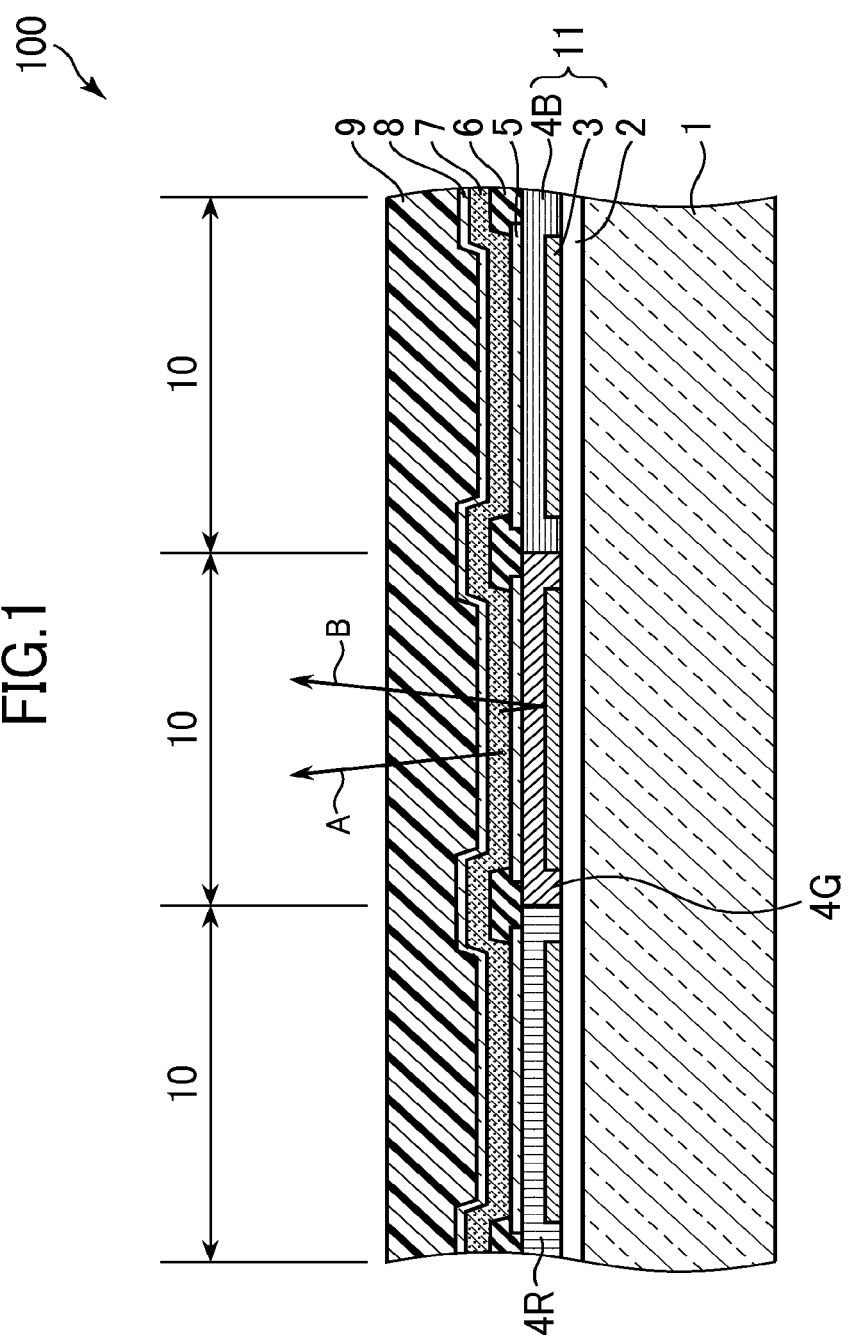
FIG. 1 is a schematic cross-sectional view illustrating a pixel portion of an EL display device according to a first embodiment of the present invention.

FIG. 1 is a schematic cross-sectional view illustrating a pixel portion of an EL display device 100 according to a first embodiment of the present invention.

The EL display device 100 regularly arranges a large number of pixels 10 on an insulating first substrate 1, and controls the amount of light emission of an EL layer 7 at a position corresponding to each pixel 10 to form an image. For that reason, a circuit layer 2 in which electric circuits including TFTs (thin film transistors) for controlling the amount of current flowing in the respective pixels 10 are regularly (in a lattice pattern in this embodiment) arranged is formed on the first substrate 1. The first substrate 1 is formed of a glass substrate in this embodiment, but a material of the first substrate 1 is not particularly limited if the substrate is made of an insulating material. The first substrate 1 may be made of synthetic resin or other material. Also, the first substrate 1 may be transparent or opaque.

The circuit layer 2 includes an appropriate insulating layer, lines including scanning signal lines, video signal lines, a power line, and a ground line, and the TFTs each formed of respective electrodes of a gate, a source, and a drain, and a semiconductor layer. Since the electric circuits configuring the circuit layer, and a cross-sectional structure of the electric circuits are well known, their details will be omitted in this example, and those circuits are simplified, and merely indicated as the circuit layer 2.

Reflection layers 3 are each formed on the circuit layer 2 for each of the pixels 10, independently. The reflection layers 3 each have a function of reflecting light emission from an EL layer 7 disposed in an upper layer of the reflection layers 3. The reflection layers 3 may be formed of an appropriate metal film, and may be made of, for example, aluminum, chrome, silver, or an alloy thereof. Also, in this embodiment, the reflection layers 3 are arranged for each of the pixels 10, independently, that is, in a manner where the reflection layers 3 corresponding to the respective pixels do not contact each other. Alternatively, the reflection layers 3 may contact each other, and an overall region in which the pixels 10 of the EL display device 100 are arranged may be covered with the reflection layers 3.

Color filters 4R, 4G, and 4B are disposed on upper layers of the reflection layers 3 in correspondence with the respective pixels 10. The respective color filters are formed of films colored to transmit a light beam having a color to be colored by the respective pixels 10. In this example, the color filter 4R corresponds to red, the color filter 4G corresponds to green, and the color filter 4B corresponds to blue. The respective color filters 4R, 4G, and 4B are each made of an organic material such as polyimide or acrylic resin added with dye or pigment.

Lower electrodes 5 are disposed on upper layers of the color filters 4R, 4G, and 4B for each of the pixels 10. The lower electrodes 5 are separated from each other by pixel separation films 6 (also called banks) and insulated. The lower electrodes 5 are formed of transparent conductive films, and preferably made of a conductive metal oxide such as ITO (indium tin oxide) or InZnO (indium zinc oxide), or the conductive metal oxide mixed with metal such as silver. Also, the pixel separation films 6 may be made of any insulating material, and made of an organic insulating material such as polyimide or acrylic resin, or silicon nitride. The pixel separation films 6 are arranged along boundaries of the respective pixels 10, and separate the respective pixels 10 from each other. In the respective pixels 10, each portion surrounded by the pixel separation films 6 is a luminescent region, which is called aperture area.

The EL layer 7 is disposed in an upper layer of the lower electrodes 5 and the pixel separation films 6. The EL layer 7 is not independent for each of the pixels, and disposed to cover an overall region in which the pixels 10 of the EL display device 100 are arranged. Also, the luminescent color of the EL layer 7 is white. In general, the white light emission is obtained as a synthetic color by laminating EL materials that emit lights with a plurality of colors, for example, the respective colors of red, green, and blue, or yellow and blue. In this embodiment, a specific configuration of the EL layer 7 is not particularly limited, but any of a single layer and a laminated layer, and any layer structure are applicable if the white light emission is resultantly obtained. Also, a material configuring the EL layer may be organic or inorganic, but an organic material is used in this embodiment.

Further, an upper electrode 8 is disposed on an upper portion of the EL layer 7. The upper electrode 8 is not also independent for each of the pixels, and disposed to cover an overall region in which the pixels 10 of the EL display device 100 are arranged. The upper electrode 8 is also formed of a transparent conductive film, and preferably made of a conductive metal oxide such as ITO or InZnO mixed with silver or magnesium, or the lamination of a metal thin film made of silver or magnesium and a conductive metal oxide.

Further, a sealing layer 9 is disposed in an upper layer of the upper electrode 8, and prevents oxygen or moisture from entering the respective layers including the EL layer 7 to protect those layers. The sealing layer 9 may be made of silicon nitride or an appropriate organic material such as an epoxy resin, or the sealing layer 9 may be configured by laminating a plurality of different materials on each other. A transparent material is selected as the sealing layer 9.

With the above structure, when holes or electrons of the amount controlled by the electric circuits arranged in the circuit layer 2 are implanted into the EL layer 7 by the lower electrodes 5 and the upper electrode 8, the EL layer 7 located at positions corresponding to the respective pixels 10 of the EL display device 100 emits a light with a brightness corresponding to the amount of current. The polarities of the lower electrodes 5 and the upper electrode 8 are not particularly limited, but in this embodiment, the lower electrodes 5 function as anodes, and the upper electrode 8 functions as a cathode. The EL display device 100 is of a so-called top emission type, and extracts the light emission from a side of the first substrate 1 where the EL layer 7 is formed. Therefore, the side of the first substrate 1 where the EL layer 7 is formed is called front side, and an opposite side thereof is called rear side. In FIG. 1, an upper side is a front side.

For example, a part of the light emission produced by the EL layer 7 in the pixels 10 shown in the center of FIG. 1 travels toward the front side as indicated by an arrow A in the figure, is transmitted through the upper electrode 8 and the sealing layer 9, and extracted from the front side. Because the light beam does not pass through the color filter 4G, the light beam is white. On the contrary, another part of the light emission produced in the EL layer 7 travels toward the rear side as indicated by an arrow B in the figure, is reflected by the reflection layers 3 after passing through the color filter 4G, again passes through the color filter 4G, and is extracted from the front side. For that reason, this light beam becomes green. An observer of the EL display device 100 observes the synthesis of a light beam A and a light beam B as the light emission of the center pixel 10 in FIG. 1.

As a result, because the light emission color of the respective pixels 10 becomes the mixture of the light beam having a color corresponding to the corresponding color filter of the pixels 10 with the white light, a color purity is not always high, but the light beam from the pixels 10 adjacent to the color filter corresponding to a given pixel 10 does not enter the given pixel 10. As a result, no problem about color mixture occurs.

In the above-mentioned discussion, for simplification of the description, a part of the light emission produced by the EL layer 7, which travels toward the front side, is extracted from the front side as indicated by the arrow A in the figure as it is. However, this description is not accurate. This is because the upper electrode 8 is formed by mixing the conductive metal oxide with metal such as silver or magnesium, or by laminating the metal thin film and the conductive metal oxide on each other for the purpose of increasing an electric conductivity thereof, but the upper electrode 8 is not a complete transparent film, and has a property as a half mirror that reflects apart of the incident light beam. For that reason, a portion (this rate depends on the reflectance of the upper electrode 8) of an appreciable extent of the light beam A which enters the upper electrode 8 from the EL layer 7 is reflected by the upper electrode 8, and extracted from the front side after passing through the color filter 4G as with the light beam indicated by the arrow B in the figure. Therefore, the color purity of the light emission color obtained by the EL display device 100 shown in the figure is higher than that a conceivable case in which all of the light emission which travels toward the front side from the EL layer 7 are extracted from the front side as it is. Therefore, the upper electrode 8 functions as a partial reflection film formed in the upper layer of the EL layer 7 in which a part of the incident light beam is reflected while the remaining light beam is transmitted through the upper electrode 8. In this situation, it is preferable that the upper electrode 8 is formed of a cathode. In this case, the upper electrode 8 is supplied with electrons, and implants the electrons into the EL layer 7. This is because a large number of free electrons exist in the upper electrode 8, the light beam that enters the upper electrode 8 is more liable to be reflected.

Also, in general, a thickness of the EL layer 7 is relatively close to a wavelength of the emitted light. In this case, when the reflection layers 3 are arranged immediately below (that is, just lower side of the lower electrodes 5) the EL layer 7 as in a general top-emission EL display device, a so-called microcavity effect occurs by an interference with the reflection light, with a phenomenon that a light emission strength in a normal direction of the EL layer 7 is improved whereas the light emission strength in another direction is lessened. This phenomenon is disadvantageous in obtaining a wide viewing angle. However, in the EL display device 100 according to this embodiment, the color filters 4R, 4G, and 4B are disposed between the EL layer 7 and the reflection layers 3, and the thicknesses of those color filters 4R, 4G, and 4B are sufficiently larger than the wavelength of the emitted light. Therefore, the above-mentioned microcavity effect does not occur. For that reason, the EL display device 100 according to this embodiment is small in a viewing angle dependency (a change in the brightness when the EL display device 100 is obliquely viewed is small).

Also, as compared with the general top-emission EL display device, in the EL display device 100 according to this embodiment, the light beam that enters the color filters 4R, 4G, and 4B is reflected by the reflection layers 3, thereby always passing through the color filters 4R, 4G, and 4B twice. This means that the thickness necessary for the color filters in order to obtain the same color purity is halved as compared with a configuration in which the light beam passes through the color filters only once. For that reason, as compared with the general top-emission EL display device in which the color filters are arranged in the upper layer of the EL layer, the thickness of the color filters 4R, 4G, and 4B in the EL display device 100 according to this embodiment can be thinned.

Also, the EL display device 100 according to this embodiment is advantageous in a manufacturing facility. That is, particularly, in the high-definition or downsized display device in which the individual pixels are fine, because the size of the respective pixels 10 is small, it is difficult to color-code the EL layer 7 in correspondence with the colors of the respective pixels 10, and a single layer of the white light emission needs to be provided as in this embodiment. On the contrary, because a technique of photolithography can be used in the formation of the color filters, it is easy to color-code the color filters for each of the pixels 10. However, because a process of damaging the EL layer 7 is included in the photolithography, it is difficult to form the color filters directly on the front side of the EL layer 7. In view of this fact, in the structure of the EL display device 100 according to this embodiment, because it is only necessary to form the EL layer 7 after the color filters 4R, 4G, and 4B have been formed on the first substrate 1, the manufacture of the EL display device 100 is easy.

In the EL display device 100 according to this embodiment, an upper surface of the sealing layer 9 serves as an observation surface of the EL display device 100. Alternatively, a transparent substrate made of glass or a synthetic resin may be further arranged in an upper layer of the sealing layer 9.

Figure 2:
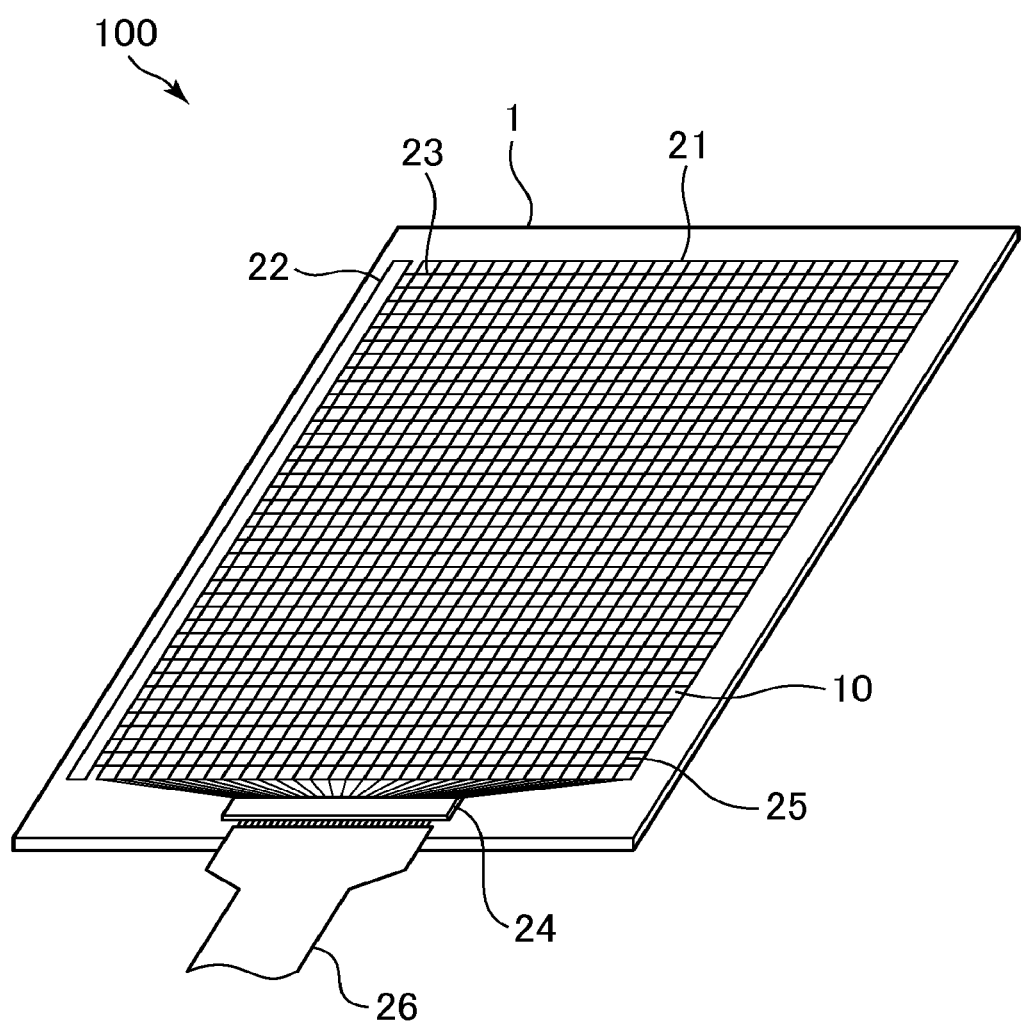
FIG. 2 is a schematic perspective view illustrating the EL display device according to the first embodiment of the present invention.

FIG. 2 is a schematic perspective view illustrating the EL display device 100 according to the first embodiment of the present invention. In the EL display device 100, a rectangular display region 21, which is a region where the pixels 10 are arranged, is disposed on the rectangular first substrate 1. A scanning circuit 22 is arranged adjacent to any one of right and left sides of the display region 21, or both sides thereof. In this embodiment, the scanning circuit 22 is disposed on only the left side of the display region 21. A large number of scanning signal lines 23 extend from the scanning circuit 22 to the display region. As illustrated in the figure, the scanning circuit 22 may be provided by directly preparing a circuit per se on a surface of the first substrate 1 through a technique such as a so-called SOG (system on glass), or may be provided by implementing a semiconductor chip. Also, a driver circuit 24 is disposed adjacent to a near side of the display region. A large number of video signal lines 25 extend from the driver circuit 24 toward the display region, and is orthogonal to the scanning signal lines 23. A region surrounded by the respective adjacent scanning signal lines 23 and video signal lines 25 configures one pixel 10. The driver circuit 24 may be prepared directly on the surface of the first substrate 1 as with the scanning circuit 22. In this embodiment, the driver circuit 24 is provided by implementing a semiconductor chip. The driver circuit 24 is connected with an FPC (flexible printed circuit) 26, and image data is supplied to the driver circuit 24 from an external device.

The image data supplied from the external device is converted into a voltage signal indicative of the brightness of each pixel 10, and output to the video signal lines 25 by the driver circuit 24, and supplied to the pixel 10 corresponding to the scanning signal line 23 selected by the scanning circuit 22. The pixels 10 each emit a light with a brightness corresponding to the supplied voltage signal by a pixel circuit disposed in each of the pixels 10. In this way, a large number of pixels 10 disposed in the display region 21 in the lattice pattern emit the light with the brightness corresponding to given image data, thereby to form an image in the display region 21.

Incidentally, as is apparent from the above description, in the EL display device 100 according to this embodiment, when a color selection reflection layer that selectively reflects the light beam having a specific color on the front side is formed in each lower layer of the EL layer 7 and the lower electrodes 5, the above function is satisfied. In the first embodiment illustrated in FIG. 1, the color filters 4R, 4G, and 4B, and the reflection layers 3 configure a color selection reflection layer 11 in cooperation with each other.

Second Embodiment

Figure 3:
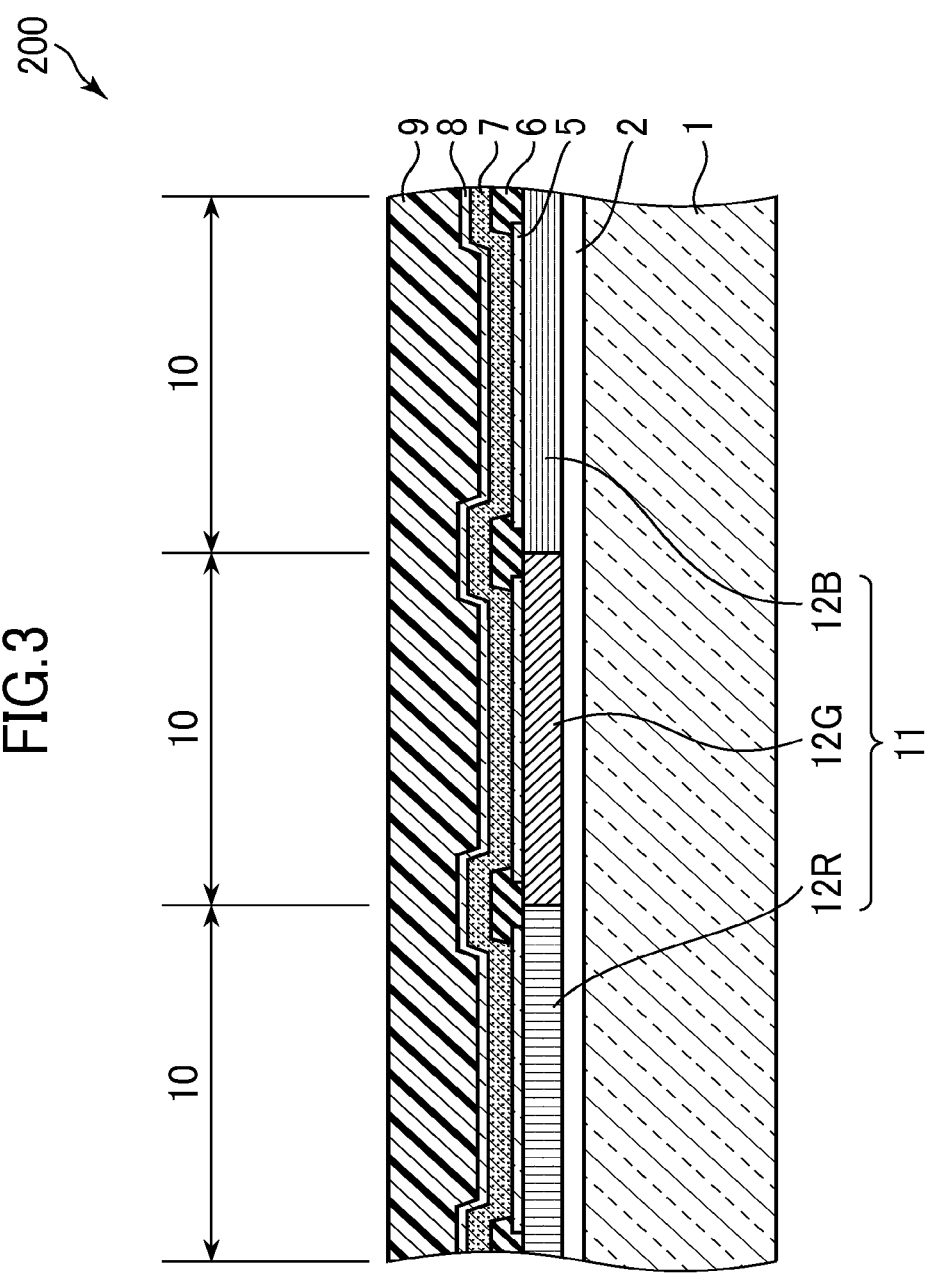
FIG. 3 is a schematic cross-sectional view illustrating a pixel portion of an EL display device according to a second embodiment of the present invention.

On the contrary, in an EL display device 200 according to a second embodiment of the present invention illustrated in FIG. 3, the color selection reflection layer 11 is formed of a single layer. FIG. 3 is a schematic cross-sectional view illustrating a pixel portion of the EL display device 200 according to the second embodiment of the present invention. In this embodiment, parts common to those in the above first embodiment are denoted by the same symbols, and a repetitive description will be omitted.

In the EL display device 200, dichroic mirror layers 12R, 12G, and 12B are disposed as the color selection reflection layer 11. The dichroic mirror layer 12R has a property of selectively reflecting only red color, and transmitting the other lights. The dichroic mirror layers 12G and 12B also reflect green light and blue light, respectively. In this embodiment, the light beams that have been transmitted through the dichroic mirror layers 12R, 12G, and 12B arrive at the circuit layer 2, and are absorbed therein. In order to prevent the reflection of the transmitted light, a light absorbing layer of, for example, black, which absorbs the light, may be disposed in a lower layer of the dichroic mirror layers 12R, 12G, and 12B.

An outer appearance of the EL display device 200 according to this embodiment is identical with that of FIG. 2 illustrated as the schematic perspective view of the EL display device 100 according to the above first embodiment.

Incidentally, in the description of the above-mentioned first embodiment, the upper electrode 8 (refer to FIG. 1) functions as the partial reflection film, and has the function of increasing the color purity of the light emission color obtained by the EL display device 100. Further, in order to obtain the higher color purity by obtaining the same effect by addition, an additional partial reflection film may be further formed in an upper layer of the upper electrode 8. This additional partial reflection film may have any structure in which a part of the incident light beam is reflected, and the remaining part thereof is transmitted through the partial reflection film. That is, apart of the light beam output from the upper electrode 8 to the front side may be reflected to the rear side, and the remaining part thereof may be transmitted through the partial reflection film. As the above film, for example, it is conceivable that a half mirror formed of a metal thin film made of silver or aluminum is formed on an overall front surface of the upper electrode 8. Alternatively, a reflection layer that covers a part of the aperture area of the pixels 10 may be newly formed.

Third Embodiment

Figure 4:
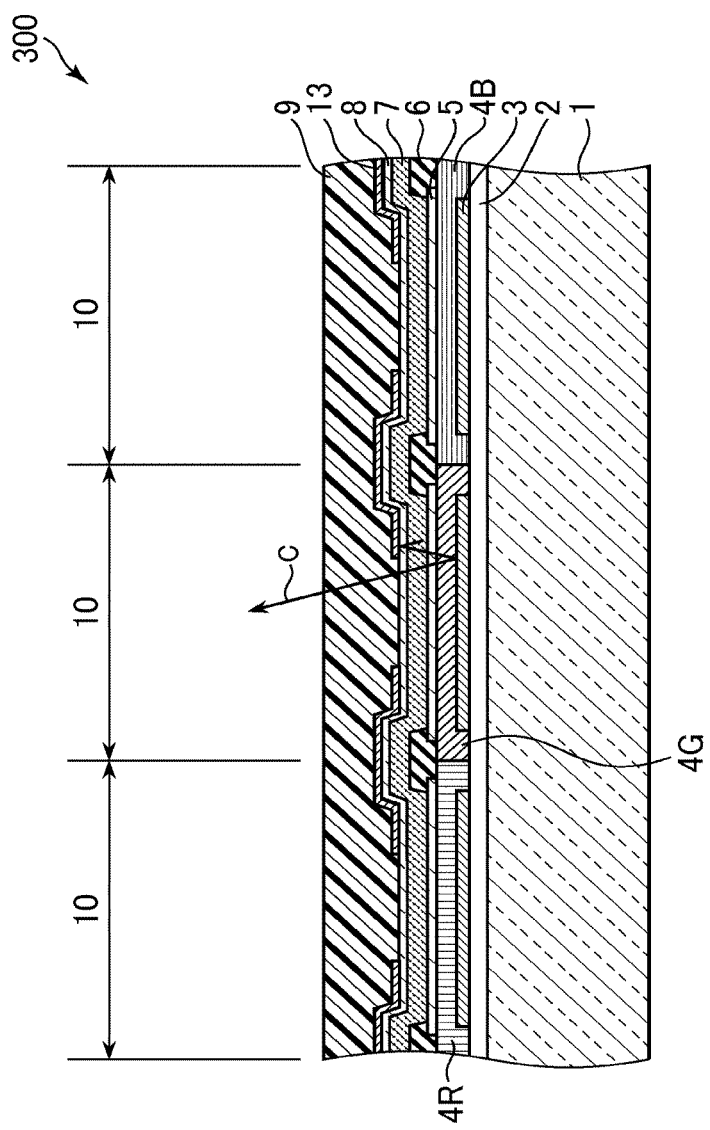
FIG. 4 is a schematic cross-sectional view illustrating a pixel portion of an EL display device according to a third embodiment of the present invention.

In an EL display device 300 according to a third embodiment of the present invention illustrated in FIG. 4, a reflection layer that covers a part of the aperture area of the pixels 10 is formed in the upper layer of the upper electrode 8. FIG. 4 is a schematic cross-sectional view illustrating a pixel portion of the EL display device 300 according to the third embodiment of the present invention. In this embodiment, parts common to those in the above first embodiment are denoted by the same symbols, and a repetitive description will be omitted.

In the EL display device 300 according to this embodiment, an auxiliary electrode 13 is disposed in the upper layer of the upper electrode 8, and immediately above the pixel separation films 6. The auxiliary electrode 13 is formed of a conductive metal film made of silver or aluminum, and small in electric resistance. Therefore, the auxiliary electrode 13 has a function of keeping a uniform potential of the overall upper electrode 8, and supplying sufficient electrons (or holes) to the EL layer 7. At the same time, the auxiliary electrode 13 is formed with a width wider than the width of the pixel separation films 6 so that a part of the auxiliary electrode 13 covers the aperture area of the pixels 10. For that reason, a part of the aperture area of the pixels 10 is obscured by the auxiliary electrode 13.

In this example, since the auxiliary electrode 13 is formed of the metal film, the auxiliary electrode 13 functions as a reflection film that reflects the light. For that reason, the light emitted on the rear side of the auxiliary electrode 13 is applied to the rear surface of the auxiliary electrode 13, and reflected therefrom as indicated by an arrow C in the figure, and input to the color filter 4G and again reflected by the reflection layers 3. Then, the light is output from a region in which the auxiliary electrode 13 is not formed to the front side. Therefore, the auxiliary electrode 13 functions as the additional partial reflection film. In this way, the rate of the light beam input to the color filters 4R, 4G, and 4B is more increased, and the color purity can be enhanced.

In this embodiment, the auxiliary electrode 13 also function as the additional partial reflection film. However, the present invention is not limited to this configuration, but the auxiliary electrode 13 and the additional partial reflection film may be provided as different components, or the auxiliary electrode 13 may not be formed. Also, the shape and arrangement of the opening portion of the additional partial reflection film is not particularly limited, and as illustrated in FIG. 4, a configuration in which the center portion of the pixel is opened as illustrated in FIG. 4 may be applied, or a configuration in which a large number of holes are arranged in the overall region may be applied. In any case, a part of the aperture area of the pixels 10 is covered with an additional partial reflection film, and a remaining part is opened without being covered with the additional partial reflection film. Then, the light beam output from the EL layer 7 and applied to the additional partial reflection film is reflected by the additional partial reflection film and the reflection layers 3, in some situations, by a plurality of times, and output from the opening of the additional partial reflection film to the front side.

An outer appearance of the EL display device 300 according to this embodiment is identical with that of FIG. 2 illustrated as the schematic perspective view of the EL display device 100 according to the above first embodiment.

Fourth Embodiment

Figure 5:
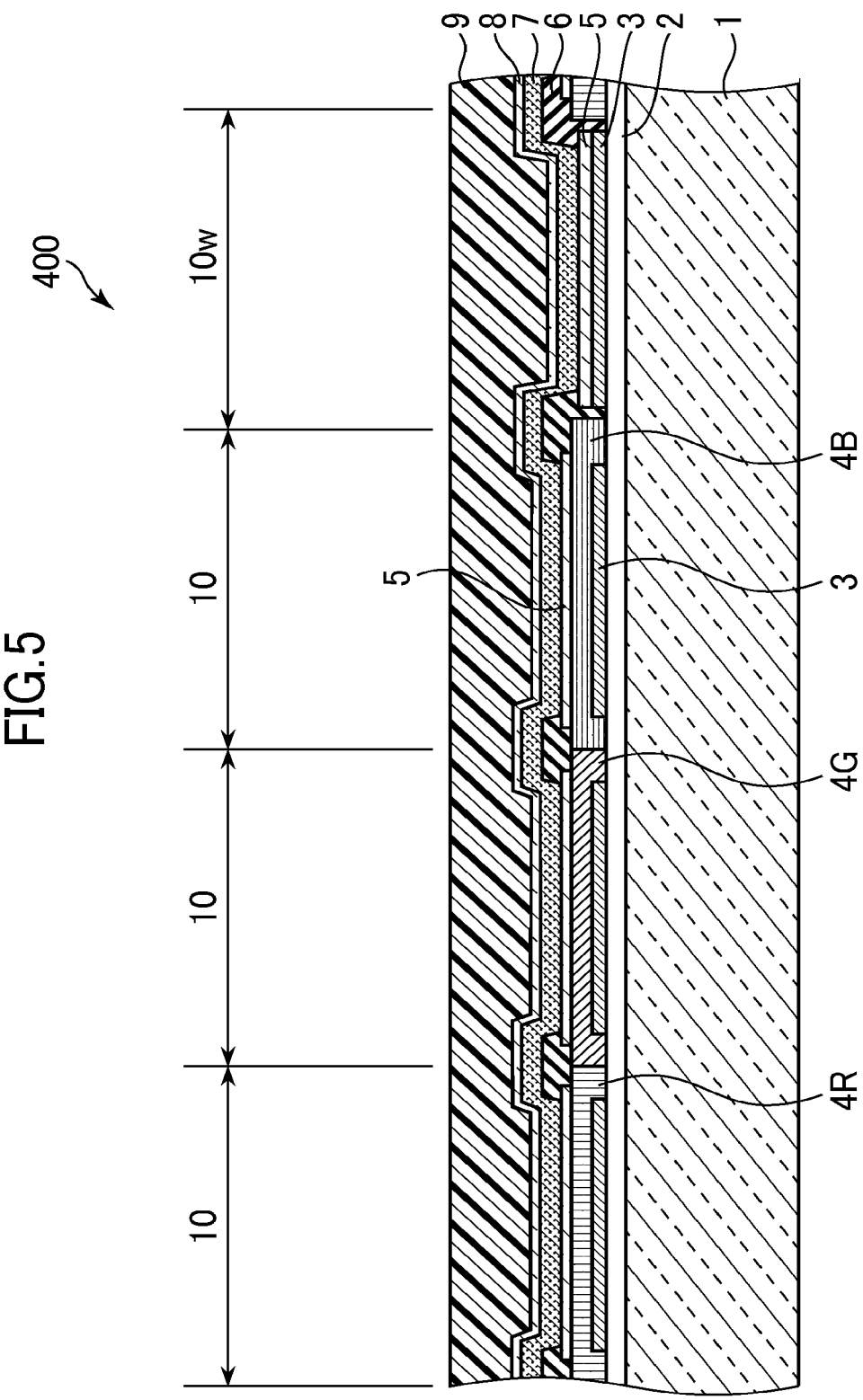
FIG. 5 is a schematic cross-sectional view illustrating a pixel portion of an EL display device according to a fourth embodiment of the present invention.

FIG. 5 is a schematic cross-sectional view illustrating a pixel portion of an EL display device 400 according to a fourth embodiment of the present invention. Similarly, in this embodiment, parts common to those in the above first embodiment are denoted by the same symbols, and a repetitive description will be omitted. The EL display device 400 according to the fourth embodiment is provided with a pixel 10W that emits a light with white in addition to the pixels 10 that emit the light with respective colors of red, blue, and green.

As shown in the figure, in the pixel 10W, the color filter is not provided, and the lower electrodes 5 are formed in the immediate upper layer of the reflection layers 3. In the pixel 10W of the white light emission, because substantially all of the light emission by the EL layer 7 can be extracted from the front side, the light emission high in brightness is obtained. With the provision of the pixel 10W of the white light emission, an image display high in brightness and large in contrast is obtained.

An outer appearance of the EL display device 400 according to this embodiment is identical with that of FIG. 2 illustrated as the schematic perspective view of the EL display device 100 according to the above first embodiment.

In the EL display device according to the first to fourth embodiments described above, the color filters are arranged only in the lower layer of the EL layer. Further, the color filters may be added in the upper layer of the EL layer.

Fifth Embodiment

Figure 6:
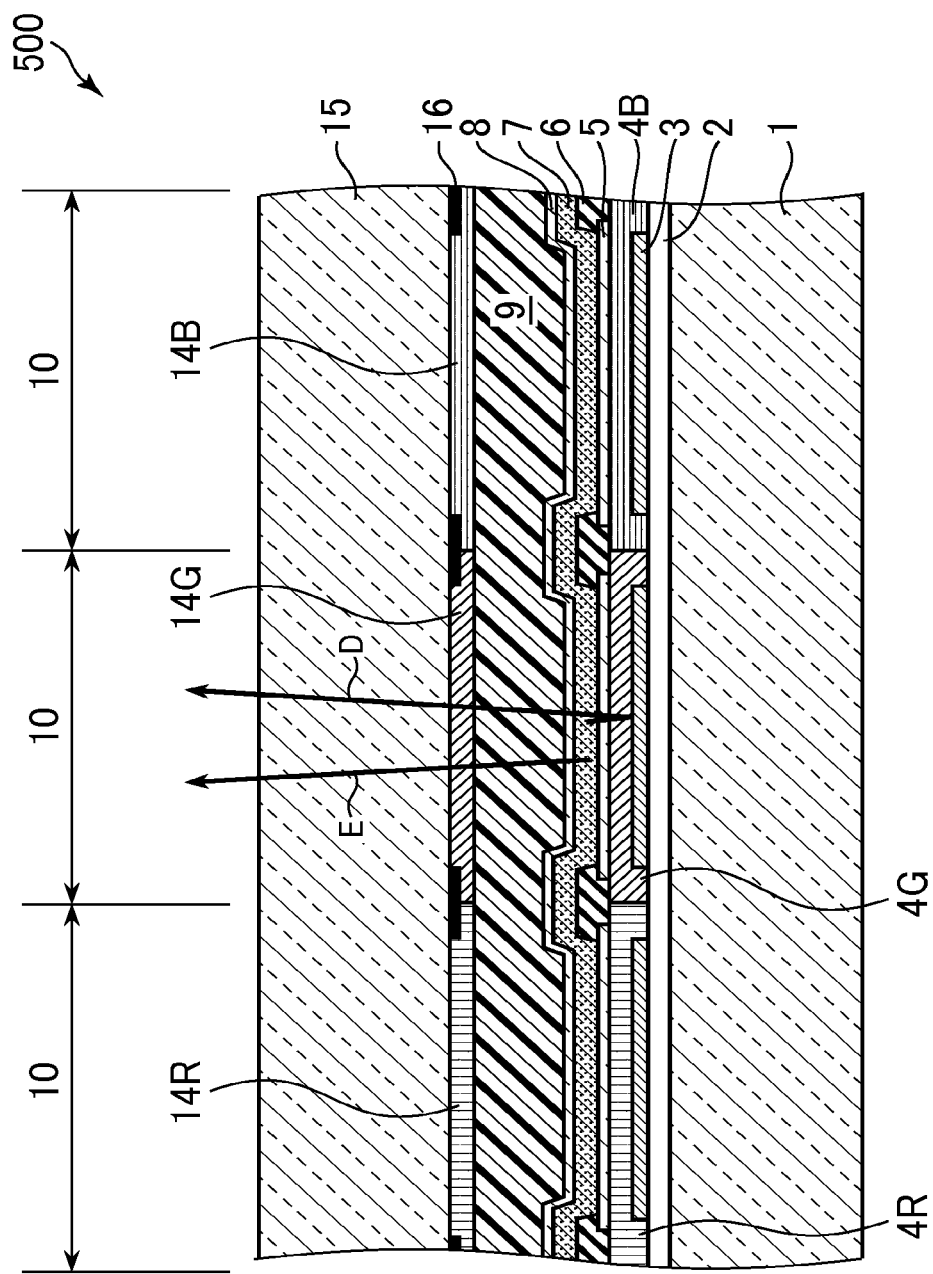
FIG. 6 is a schematic cross-sectional view illustrating a pixel portion of an EL display device according to a fifth embodiment of the present invention.

In an EL display device 500 according to a fifth embodiment of the present invention illustrated in FIG. 6, upper color filters 14R, 14G, and 14B are further added in the upper layer of the EL layer 7. FIG. 6 is a schematic cross-sectional view illustrating a pixel portion of the EL display device 500 according to the fifth embodiment of the present invention. Similarly, in this embodiment, parts common to those in the above first embodiment are denoted by the same symbols, and a repetitive description will be omitted.

In the EL display device 500 according to this embodiment, a second substrate 15, which is a transparent substrate made of glass or synthetic resin, is arranged on the front side of the sealing layer 9. The upper color filters 14R, 14G, and 14B of the colors corresponding to the light emission colors of the respective pixels 10 are formed at positions corresponding to the respective pixels 10 on the rear surface of the second substrate 15. The upper color filter 14R is colored with red, and the upper color filters 14G and 14B are colored with green and blue, respectively. Also, black matrixes 16 are formed in portions which are boundaries of the pixels 10 on the rear surface of the second substrate 15, but the black matrixes 16 are not always required, and may be omitted if unnecessary.

In the above structure, the light beam that travels from the EL layer 7 toward the rear side passes through the color filter 4G before and after being reflected by the reflection layers 3 twice as indicated by an arrow D in the figure. The light beam further passes through the upper color filter 14G. Therefore, the light beam passes through the color filter at least three times in total. For that reason, in the EL display device 500 according to this embodiment, the thickness of the color filters can be further thinned as compared with the above-mentioned embodiments. Also, as indicated by an arrow E in the figure, since the light beam that travels from the EL layer 7 toward the front side passes through at least the upper color filter 14G, the color purity can be further enhanced.

In this structure, the white light that travels from the EL layer 7 toward the front side enters the upper color filter of the adjacent pixel 10 to cause the possibility of the color mixture. However, the rate of the white light contributing to the color mixture is small as compared with the general top-emission EL display device, and its influence is limited.

Also, because the upper color filters 14R, 14G, and 14B of this structure are formed on the second substrate 15, the EL layer 7 is not damaged in the manufacture process.

Figure 7:
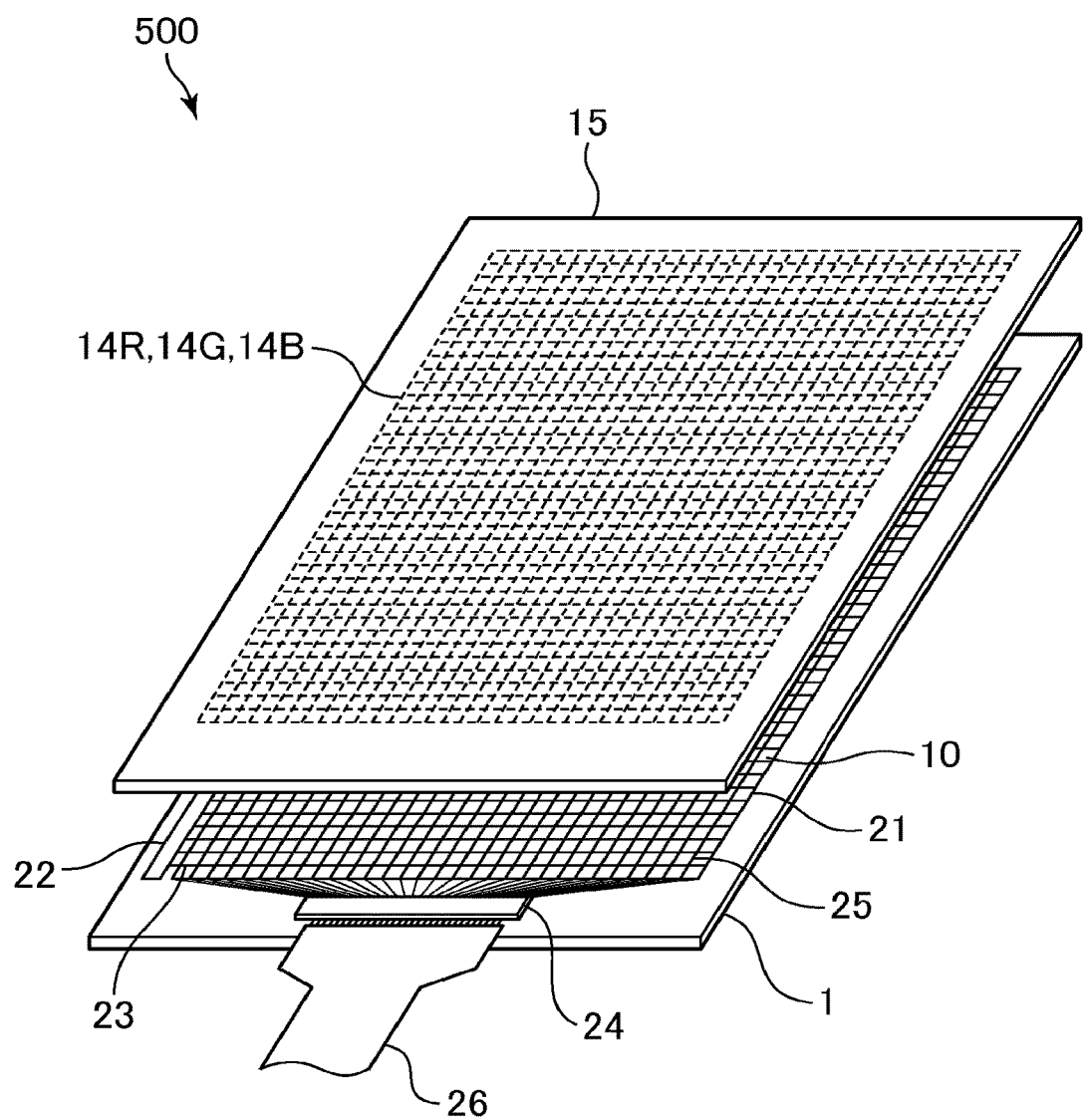
FIG. 7 is a schematic exploded perspective view illustrating the EL display device according to the fifth embodiment of the present invention.

FIG. 7 is a schematic exploded perspective view illustrating the EL display device 500 according to the fifth embodiment of the present invention. As in the EL display device 100 according to the above first embodiment, in the first substrate 1 of the EL display device 500 are arranged the display region 21 in which a large number of pixels 10 are arranged, a large number of scanning signal lines 23 and video signal lines 25 which extend within the display region 21, and section the pixels 10, the scanning circuit 22 connected with the scanning signal lines 23, the driver circuit 24 connected with the video signal lines 25, and the FPC 26.

Further, the second substrate 15 is arranged on the front surface side of the first substrate 1. On the rear surface of the second substrate, the upper color filters 14R, 14G, and 14B are formed at positions corresponding to the respective pixels 10 of the display region 21 (indicated by dashed lines). Also, the second substrate 15 is smaller in dimension than the first substrate 1, and the driver circuit 24 and the FPC 26 are exposed without being covered with the second substrate 15. In this embodiment, a dimension of the second substrate 15 in a depth direction in the figure is smaller than the dimension of the first substrate 1 in the depth direction. The dimension of the second substrate 15 in the width direction in the figure is identical with the dimension of the first substrate 1 in the width direction.

Sixth Embodiment

Figure 8:
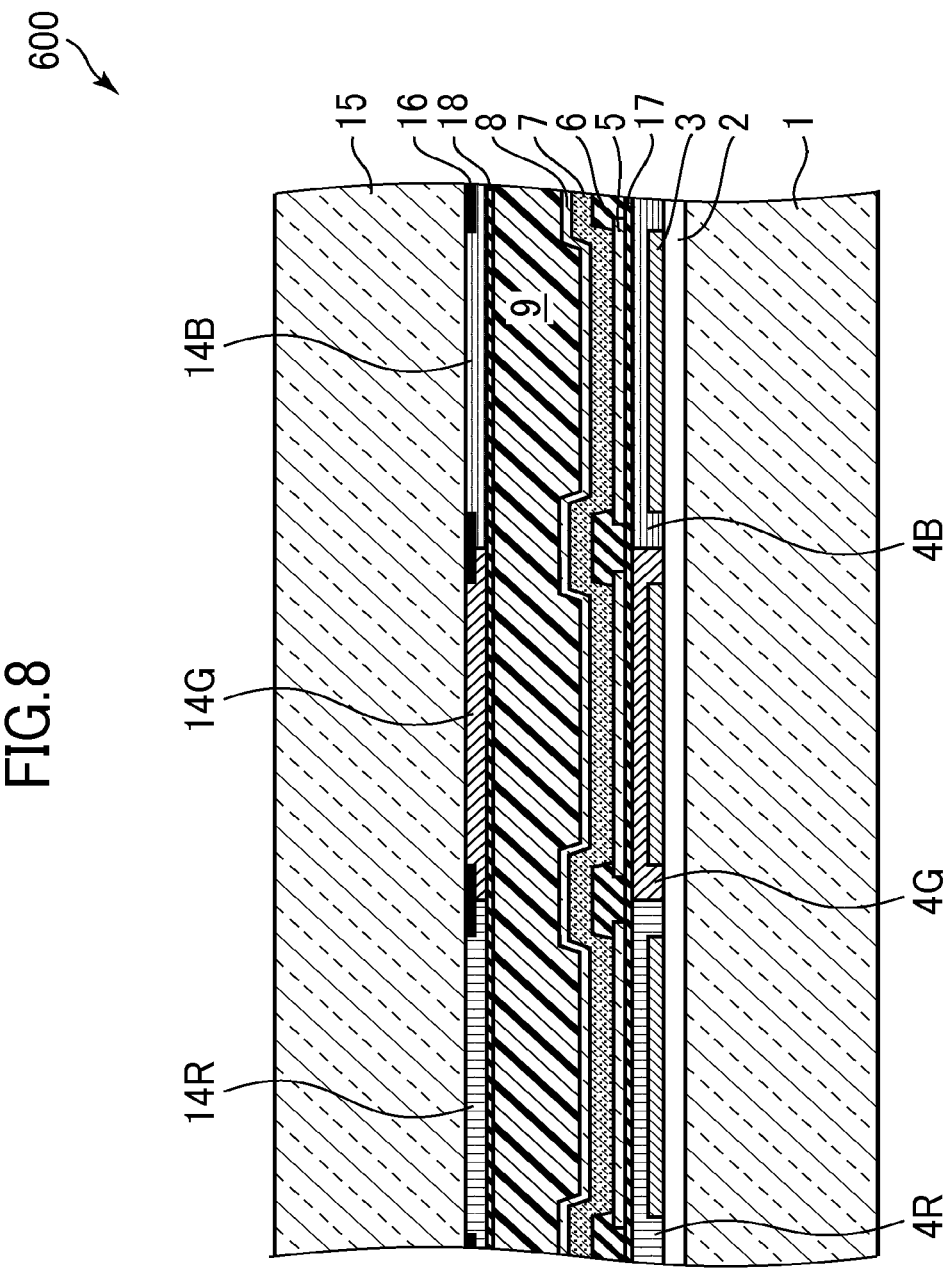
FIG. 8 is a schematic cross-sectional view illustrating a pixel portion of an EL display device according to a sixth embodiment of the present invention.

In an EL display device 600 according to a sixth embodiment of the present invention illustrated in FIG. 8, a protective layer is added to the EL display device 500 of the above fifth embodiment. FIG. 8 is a schematic cross-sectional view illustrating a pixel portion of the EL display device 600 according to a sixth embodiment of the present invention. Similarly, in this embodiment, parts common to those in the above first embodiment are denoted by the same symbols, and a repetitive description will be omitted.

As shown in the figure, an insulating first protective layer 17 is formed between the lower electrodes 5 and the color filters 4R, 4G, and 4B. Also, a second protective layer 18 is formed on the surface of the upper color filters 14R, 14G, and 14B formed on the rear surface of the second substrate 15.

In this way, with an arrangement of the protective layers, an influence on the EL layer 7 is more surely blocked, and the reliability of the EL display device 600 is improved. The material of the first protective layer 17 and the second protective layer 18 may be made of silicon nitride or an appropriate organic insulating film. Also, both of those two protective films are not always required, and only one protective film may be formed.

An outer appearance of the EL display device 600 according to this embodiment is identical with that of FIG. 7 illustrated as the schematic perspective view of the EL display device 500 according to the above fifth embodiment.

Seventh Embodiment

FIG. 9 is a schematic cross-sectional view illustrating a pixel portion of an EL display device 700 according to a seventh embodiment of the present invention. Similarly, in this embodiment, parts common to those in the above first embodiment are denoted by the same symbols, and a repetitive description will be omitted.

As shown in the figure, the adjacent color filters in this embodiment, a boundary between the color filter 4R and the color filter 4G, and a boundary between the color filter 4G and the color filter 4B in this example, are inclined with respect to the surface of the first substrate 1, and tapered. In this structure, in a process of photolithography in forming the color filters 4R, 4G, and 4B, the above configuration is obtained by adjusting an exposure condition and an etching condition with the use of a half tone mask. With the above structure, an unevenness formed by allowing the adjacent color filters to overlap with each other, or gaps to be formed between the adjacent color filters is reduced to obtain a flatter surface. As a result, because the structure of the upper layers, that is, the lower electrodes 5, the pixel separation films 6, the EL layer 7, and the upper electrode 8 can be stably formed, the reliability of the EL display device 700 is further enhanced.

An outer appearance of the EL display device 700 according to this embodiment is identical with that of FIG. 2 illustrated as the schematic perspective view of the EL display device 100 according to the above first embodiment.

Eighth Embodiment

FIG. 10 is a schematic cross-sectional view illustrating a pixel portion of an EL display device 800 according to an eighth embodiment of the present invention. Similarly, in this embodiment, parts common to those in the above first embodiment are denoted by the same symbols, and a repetitive description will be omitted.

In the EL display device 800, a region 19 in which the reflection layers 3 and the color filters 4R, 4G, and 4B are not formed in the display region which is the region in which the pixels are arranged, that is, the color selection reflection layer is not formed is disposed on the first substrate 1. Then, a through-hole 20 is formed in the region 19 so that the upper electrode 8 is short-circuited to the line within the circuit layer 2, and provides a common potential (the figure illustrates that the upper electrode 8 and the circuit layer 2 come into contact with each other). In this embodiment, the common potential is a ground potential. A plurality of regions 19 and through-holes 20 are formed in the display region. With this configuration, the potential of the overall upper electrode 8 is kept uniform, and sufficient electrons (or holes) are supplied to the EL layer 7.

The reason that the reflection layers 3 and the color filters 4R, 4G, and 4B are not formed in the region 19 is because a possibility that a process of peeling off those layers in order to form the through-holes 20 damages the EL layer 7 is high. When those layers can be peeled off without any influence on the EL layer 7, the region 19 is not required, and the arrangement of the through-hole 20 is arbitrary.

An outer appearance of the EL display device 800 according to this embodiment is identical with that of FIG. 2 illustrated as the schematic perspective view of the EL display device 100 according to the above first embodiment.

The configurations illustrated in the respective embodiments described above may be combined with each other. For example, the configuration having the white pixel 10W (refer to FIG. 5) illustrated in the fourth embodiment may be combined with the upper color filters 14R, 14G, and 14B (refer to FIG. 6) illustrated in the fifth embodiment. Also, the specific shapes, arrangements, and numbers of the respective members illustrated in the respective embodiments described above are exemplary, and the present invention is not limited to those configurations. An ordinary skilled person may arbitrarily design and change the shapes of those respective members according to the embodiments when implementing the present invention.

In other words, while there have been described what are at present considered to be certain embodiments of the invention, it will be understood that various modifications may be made thereto, and it is intended that the appended claims cover all such modifications as fall within the true spirit and scope of the invention.

The invention claimed is:

1. An EL display device comprising:
   a substrate;
   a pixel including a lower electrode on the substrate;
   another pixel including another lower electrode on the substrate and being adjacent to the pixel in a horizontal direction in a cross-sectional view;
   a pixel separation film provided on the substrate and having a part which has a length in the horizontal direction and is located on a boundary between the pixel and the another pixel,
   an upper electrode located above the lower electrode and the another lower electrode; and a patterned auxiliary electrode provided on the upper electrode and having another length in the horizontal direction, wherein the patterned auxiliary electrode is located on the boundary, wherein the pixel has an area which does not overlap the patterned auxiliary electrode, the another pixel has another area which does not overlap the patterned auxiliary electrode, the patterned auxiliary electrode covers the part of the pixel separation film, and the another length is longer than the length.

2. The EL display device according to claim 1, wherein the patterned auxiliary electrode comprises:

a region which overlaps the lower electrode, and does not overlap the another lower electrode and the part;

another region which overlaps the another lower electrode, and does not overlap the lower electrode and the part; and another region which overlaps the part, and does not overlap the lower electrode and the another lower electrode.

3. The EL display device according to claim 1, wherein an electro luminescence layer is located between the lower electrode and the upper electrode, and the patterned auxiliary electrode has an area which overlaps the lower electrode and the electro luminescence layer, and does not overlap the part.

4. The EL display device according to claim 1, wherein the patterned auxiliary electrode is formed of a conductive metal film.

5. The EL display device according to claim 4, wherein the conductive metal film is made of silver or aluminum.

6. The EL display device according to claim 1, wherein a material of the patterned auxiliary electrode is different from a material of the upper electrode.

7. The EL display device according to claim 1, wherein the patterned auxiliary electrode has a surface facing the upper electrode, an electroluminescence layer is located between the lower electrode and the upper electrode, the electroluminescence layer emits a light, and the surface reflects the light towards the lower electrode.

8. The EL display device according to claim 7, further comprising a reflection layer between the lower electrode and the substrate, wherein the reflection layer reflects the light towards the upper electrode.

9. The EL display device according to claim 1, wherein the pixel separation film has a aperture area which exposes the lower electrode and another aperture area which exposes the another lower electrode, and the patterned auxiliary electrode overlaps a part of the aperture area and another part of the another aperture area.

10. The EL display device according to claim 9, wherein the aperture area has a portion which does not overlap the patterned auxiliary electrode, and the another aperture area has another portion which does not overlap the patterned auxiliary electrode.

11. An EL display device comprising:

a substrate;

a lower electrode on the substrate;

an upper electrode on the substrate;

an electro luminescence layer between the lower electrode and the upper electrode;

a pixel separation film having an aperture area, the aperture area exposing a part of the lower electrode; and a patterned auxiliary electrode on the upper electrode, wherein the patterned auxiliary electrode has a region that does not overlap the pixel separation film and another region that overlaps the pixel separation film, the region overlaps a part of the aperture area, and the aperture area has a portion which does not overlap the patterned auxiliary electrode.

12. The EL display device according to claim 11, wherein the another region does not overlap the aperture area.

13. The EL display device according to claim 11, wherein the patterned auxiliary electrode is formed of a conductive metal film.

14. The EL display device according to claim 11, wherein a material of the patterned auxiliary electrode is different from a material of the upper electrode.

15. The EL display device according to claim 11, wherein the patterned auxiliary electrode has a surface facing the upper electrode, the electro luminescence layer emits light, and the surface reflects the light toward the lower electrode.

16. The EL display device according to claim 11, wherein the pixel separation film has a width which extends in a horizontal direction in a cross-sectional view, the patterned auxiliary electrode has another width which extends in the horizontal direction, and the another width is wider than the width.

17. The EL display device according to claim 16, further comprising:

a pixel including the lower electrode;

another pixel adjacent to the pixel in the horizontal direction, wherein the pixel separation film has an area corresponding to the width, the area extended from the pixel to the another pixel continuously.

* * * * *